United States Patent
Kurosawa et al.

(10) Patent No.: US 7,183,645 B2
(45) Date of Patent: *Feb. 27, 2007

(54) SEMICONDUCTOR DEVICE WITH EXTERNAL TERMINAL JOINED TO CONCAVE PORTION OF WIRING LAYER

(75) Inventors: Yasunori Kurosawa, Fujimi-machi (JP); Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 42 days.

This patent is subject to a terminal disclaimer.

(21) Appl. No.: 10/803,178

(22) Filed: Mar. 17, 2004

(65) Prior Publication Data

US 2005/0012209 A1  Jan. 20, 2005

(30) Foreign Application Priority Data

Mar. 20, 2003 (JP) .............................. 2003-078094
Nov. 14, 2003 (JP) .............................. 2003-385419

(51) Int. Cl.
*H01L 23/48* (2006.01)
*H01L 23/52* (2006.01)

(52) U.S. Cl. ...................................... 257/737; 257/738
(58) Field of Classification Search ........ 257/737–738, 257/759, 778–780
See application file for complete search history.

(56) References Cited

U.S. PATENT DOCUMENTS 5,677,566 A    10/1997  King et al.
6,166,444 A *  12/2000  Hsuan et al. ................ 257/777
6,323,542 B1   11/2001  Hashimoto
6,455,408 B1 *  9/2002  Hwang et al. .............. 438/613
6,518,162 B2    2/2003  Ono et al.
6,756,688 B2 *  6/2004  Narizuka et al. ........... 257/779
6,767,817 B2 *  7/2004  Farnworth et al. ......... 438/612
2002/0008320 A1  1/2002  Kuwabara et al.
2004/0245621 A1* 12/2004  Hanaoka et al. ........... 257/690

FOREIGN PATENT DOCUMENTS

JP     11-297873      10/1999
JP     2001-244372     9/2001
JP     2003-209137     7/2003
WO     WO00/55898      9/2000

* cited by examiner

*Primary Examiner*—Phat X. Cao
*Assistant Examiner*—Theresa T. Doan
(74) *Attorney, Agent, or Firm*—Hogan & Hartson LLP

(57) ABSTRACT

A semiconductor device includes a semiconductor chip provided with an integrated circuit and a pad that is electrically connected to the integrated circuit. A wiring layer has a concave portion and is electrically connected to the pad. An external terminal is joined to the concave portion of the wiring layer. A resin layer is provided with a through hole and is disposed on the wiring layer. The through hole and the concave portion reside at the same position.

12 Claims, 6 Drawing Sheets

SEMICONDUCTOR DEVICE WITH EXTERNAL TERMINAL JOINED TO CONCAVE PORTION OF WIRING LAYER

BACKGROUND OF THE INVENTION

1. Field of the Invention

The present invention relates to a semiconductor wafer, a semiconductor device and a method for manufacturing the same, a circuit board, and an electronic apparatus.

2. Description of Related Art

Surface-mounted packages are known to be semiconductor devices that satisfy requirements, such as mountability or greater packaging density. For example, in a chip scale/size package (CSP), wirings are disposed on a semiconductor chip with a resin layer interposed therebetween, and an external terminal (for example, a solder ball) is provided on the wirings. Thus, when the external terminal is provided on the wirings, it is required that the bonding strength and the electrical connectivity between them be improved.

It is an advantage of the present invention to improve the bonding strength and the electrical connectivity between the wirings and external terminals.

A semiconductor device according to the present invention includes a semiconductor chip provided with an integrated circuit and a pad that is electrically connected to the integrated circuit. A wiring layer has a concave portion and is electrically connected to the pad. An external terminal is joined to the concave portion of the wiring layer. A resin layer has a through hole and is disposed on the wiring layer. The through hole and the concave portion reside at the same position. According to the present invention, the bonding strength between the wiring layer and the external terminal increases because of the formation of the concave portion in the wiring layer. In addition, the formation of the concave portion results in a larger contact area between the wiring layer and the external terminal, and thereby the electrical connectivity between them is improved.

According to an embodiment of the present invention, the width of the concave portion may increase with depth, the concave portion may have a first width at a first depth and a second width at a second depth that is deeper than the first depth with the first width being larger than an opening size of the concave portion and the second width being smaller than the first width. The inner surface of the through hole in the resin layer may be in contact with the external terminal, and a stress relaxation layer is disposed on the semiconductor chip and the wiring layer may be disposed on the stress relaxation layer.

In the semiconductor device, the resin layer may be prepared from a solder resist. A circuit board according to the present invention includes the semiconductor device described above and an electronic apparatus according to the present invention includes the semiconductor device described above.

A semiconductor wafer according to an embodiment of the present invention includes a semiconductor substrate provided with a plurality of integrated circuits and pads each electrically connected to each of the integrated circuits. A wiring layer has a concave portion and is electrically connected to the pads. An external terminal is joined to the concave portion of the wiring layer. A resin layer has a through hole and is disposed on the wiring layer. The through hole and the concave portion reside at the same position. According to the present invention, the bonding strength between the wiring layer and the external terminal increases because of the formation of the concave portion in the wiring layer. In addition, the formation of the concave portion results in a larger contact area between the wiring layer and the external terminal, and thereby the electrical connectivity between them is improved. According to an embodiment of the present invention, the width of the concave portion may increase with depth and the concave portion may have a first width at a first depth and a second width at a second depth that is deeper than the first depth, the first width being larger than an opening size of the concave portion and the second width being smaller than the first width.

The inner surface of the through hole in the resin layer may be in contact with the external terminal, a stress relaxation layer is disposed on the semiconductor substrate and the wiring layer is disposed on the stress relaxation layer, and the resin layer may be prepared from a solder resist.

A method for manufacturing a semiconductor device includes forming a wiring layer over a semiconductor substrate provided with a integrated circuit and a pad that is electrically connected to the integrated circuit. The wiring layer is electrically connected to the pad. The method also includes forming a resin layer so as to cover the wiring layer, forming a through hole and a concave portion in the resin layer and the wiring layer respectively, the through hole and the concave portion residing at the same position, and providing an external terminal so as to be joined to the concave portion of the wiring layer. According to the present invention, the bonding strength between the wiring layer and the external terminal increases because the wiring layer has the concave portion in which the external terminal is placed. In addition, the formation of the concave portion results in a larger contact area between the wiring layer and the external terminal, and thereby the electrical connectivity between them is improved.

In a method for manufacturing the semiconductor device, the through hole may be formed in the resin layer and then the concave portion may be formed in the wiring layer.

Embodiments of the present invention will now be illustrated with reference to the drawings.

DETAILED DESCRIPTION OF THE
PREFERRED EMBODIMENTS

First Embodiment

Figure 1:
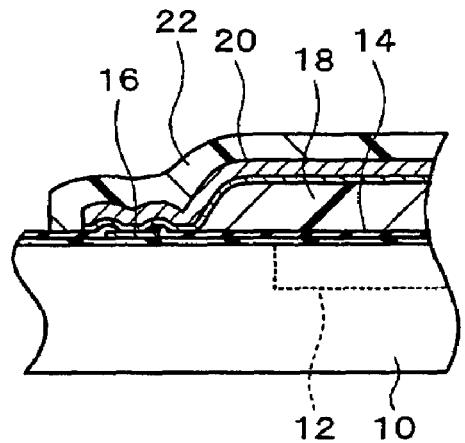
FIG. 1 illustrates a method for manufacturing a semiconductor device according to a first embodiment of the present invention.

FIGS. 1 to 4 and FIGS. 12 to 15 illustrate a method for manufacturing a semiconductor device according to a first embodiment of the present invention. In this embodiment, a semiconductor substrate 10 is used, as shown in FIG. 1. The semiconductor substrate 10 includes an integrated circuit 12. When the semiconductor substrate 10 is sectioned into a plurality of semiconductor chips, the semiconductor substrate 10 is provided with a plurality of integrated circuits 12. Therefore, individual semiconductor chips will have their respective integrated circuits 12.

A passivation film 14 may be disposed on the front surface of the semiconductor substrate 10. The passivation film 14 may be prepared from, for example, an inorganic material, such as $SiO_2$ or SiN. The passivation film 14 may be composed of multiple layers. In this case, at least one layer (for example, a surface layer) may be prepared from an organic material. The semiconductor substrate 10 is provided with a pad 16 (on the surface thereof). The pad 16 is electrically connected to the integrated circuit (for example, a semiconductor integrated circuit) 12. The passivation film 14 is not disposed at least in the center of the pad 16.

A stress relaxation layer 18 may be disposed on the semiconductor substrate 10. The stress relaxation layer 18 may be formed by applying a resin precursor (for example, a thermosetting resin precursor) on the semiconductor substrate 10 or by spin-coating of the resin precursor over the semiconductor substrate 10. The stress relaxation layer 18 may be composed of a single layer or multiple layers. The stress relaxation layer 18 is an electrically insulating layer. The stress relaxation layer 18 may be prepared from polyimide resins, silicone-modified polyimide resins, epoxy resins, silicone-modified epoxy resins, benzocyclobutene (BCB), polybenzoxazole (PBO), or the like. The stress relaxation layer 18 does not contain electrically conductive particles. The stress relaxation layer 18 may be prepared from a material having a light blocking effect.

The stress relaxation layer 18 may be prepared from a radiation-sensitive resin precursor that is sensitive to radiation (light (ultraviolet light, visible light), X-rays, and an electron beam). Radiation-sensitive resin precursors (for example, photosensitive resin precursors) are classified into a negative type, an irradiated part of which has reduced solubility and becomes insoluble, and a positive type, an irradiated part of which has increased solubility.

The stress relaxation layer 18 may not be disposed on the pad 16. The stress relaxation layer 18 may not be disposed on a sectioning region of the semiconductor substrate 10. The stress relaxation layer 18 may be formed continuously or integrally on the semiconductor substrate 10 before patterning. The stress relaxation layer 18 may be disposed in each of multiple regions (a plurality of regions provided with integrated circuits 12) of the semiconductor substrate 10. A space is present between adjacent stress relaxation layers 18.

A wiring layer 20 is disposed on the stress relaxation layer 18. The wiring layer 20 may be composed of a single layer or multiple layers. For example, a TiW layer and a Cu layer may be laminated by sputtering, and another Cu layer may be formed thereon by plating. Conventional techniques may be applied to the method for forming them. The wiring layer 20 extends over the pad 16 (so as to be electrically connected to the pad 16). The wiring layer 20 is disposed over the pad 16 and the stress relaxation layer 18. The wiring layer 20 may have a land (a portion that is wider than a line). The land is a portion for providing an external terminal 28 thereon.

A resin layer 22 may be disposed on the stress relaxation layer 18. The resin layer 22 may be prepared from a solder resist. The resin layer 22 covers the whole or a part (for example, a portion excluding a region for providing the external terminal 28) of the wiring layer 20. The resin layer 22 may cover (for example, completely cover) the stress relaxation layer 18. The resin layer 22 may be disposed such that a sectioning region of the semiconductor substrate 10 is exposed (such that the resin layer 22 does not cover the sectioning region). The resin layer 22 does not contain electrically conductive particles. The resin layer 22 may be prepared from a material having a light blocking effect.

The resin layer 22 may be formed continuously or integrally on the semiconductor substrate 10 before patterning. The resin layer 22 may be disposed in each of multiple regions (a plurality of regions that includes the integrated circuits 12) of the semiconductor substrate 10. A space is present between adjacent resin layers 22.

Figure 2:
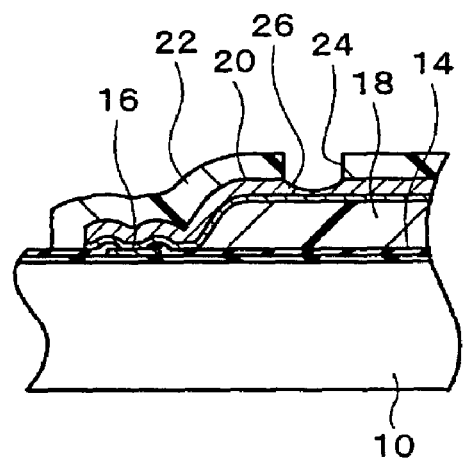
FIG. 2 illustrates the method for manufacturing a semiconductor device according to the first embodiment of the present invention.

As shown in FIG. 2, the resin layer 22 has a through hole 24. A concave portion 23 may initially be formed in the resin layer 22 (see FIG. 13), and then the concave portion 23 may be processed into the through hole 24. In a method for forming the concave portion 23, the resin layer 22 may be prepared from a radiation-sensitive resin precursor that is sensitive to radiation (light (ultraviolet light, visible light), X-rays, and an electron beam), and may be irradiated with the radiation for patterning (for example, development). Radiation-sensitive resin precursors (for example, photosensitive resin precursors) are classified into a negative type, an irradiated part of which has reduced solubility and becomes insoluble, and a positive type, an irradiated part of which has increased solubility.

Figure 12:
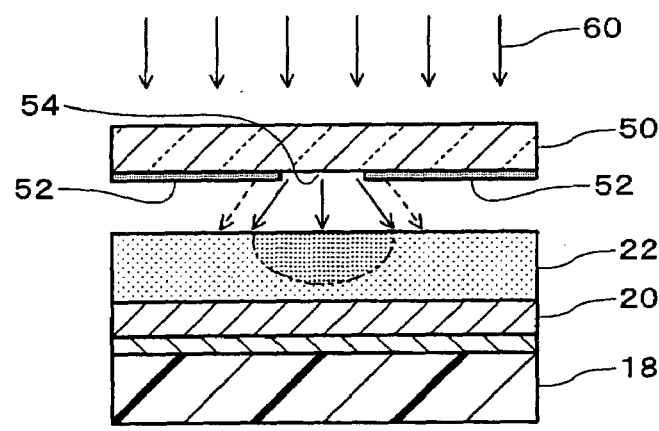
FIG. 12 illustrates the method for manufacturing a semiconductor device according to the first embodiment of the present invention.

The method for forming the concave portion 23 will now be described in more detail. In an embodiment shown in FIGS. 12 and 13, the concave portion 23 can be formed by a smaller dose of radiation (for example, at a shorter irradiation time or a lower intensity of light) in an exposure step. As shown in FIG. 12, a mask 50 is placed over the resin layer 22, and the resin layer 22 is irradiated with radiation 60 through the mask 50. According to the present embodiment, by way of example, a positive radiation-sensitive resin precursor is used. The mask 50 has a shield portion 52 against the radiation 60 and a transparent portion 54 to the radiation 60. The mask 50 may include a glass substrate and the resin layer 22 may be irradiated with the radiation 60 through the glass substrate.

Figure 13:
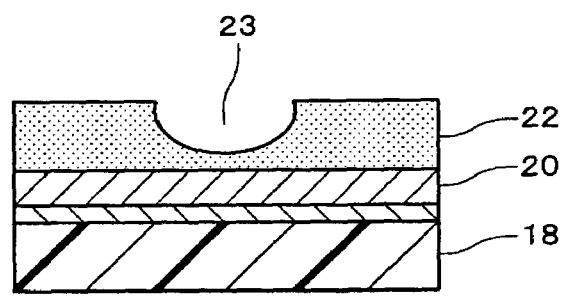
FIG. 13 illustrates the method for manufacturing a semiconductor device according to the first embodiment of the present invention.

In the present step, the dose of the radiation 60 is smaller than a dose in a typical case (for example, in a case where an opening with a straight wall is formed in the resin layer 22). Thus, the radiation 60 does not reach the bottom of the resin layer 22 (a part in contact with the wiring layer 20). The radiation 60 enters the resin layer 22 perpendicularly as well as at an angle. The radiation 60 that perpendicularly enters the resin layer 22 maintains the shape patterned in the mask 50 (in the shape corresponding to the pattern of the transparent portion 54). The radiation 60 incident at an angle is deflected at the boundary between the shield portion 52 and the transparent portion 54 of the mask 50 towards the resin layer 22. Accordingly, on the periphery directly below the shield portion 52 and the transparent portion 54 of the mask 50, the dose of the radiation 60 and therefore the radiation depth in the resin layer 22 gradually decreases with the distance from the center of the transparent portion 54. Thus, a portion in the resin layer 22 that has an increased solubility caused by the radiation 60 becomes concave. Subsequently, the portion in the resin layer 22 that has an increased solubility can be dissolved and removed in a development step to form the concave portion 23, as shown in FIG. 13.

Figure 14:
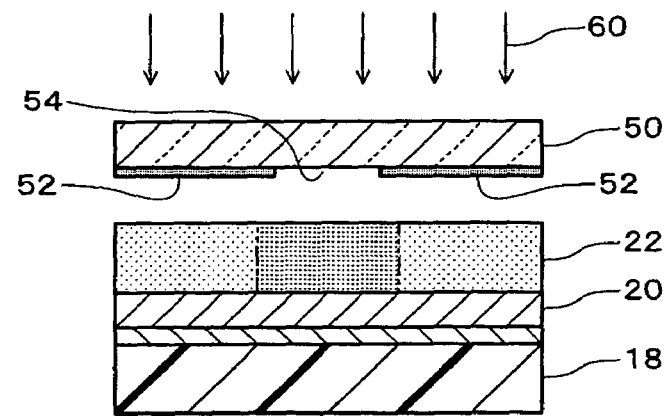
FIG. 14 illustrates the method for manufacturing a semiconductor device according to a variation of the first embodiment of the present invention.
Figure 15:
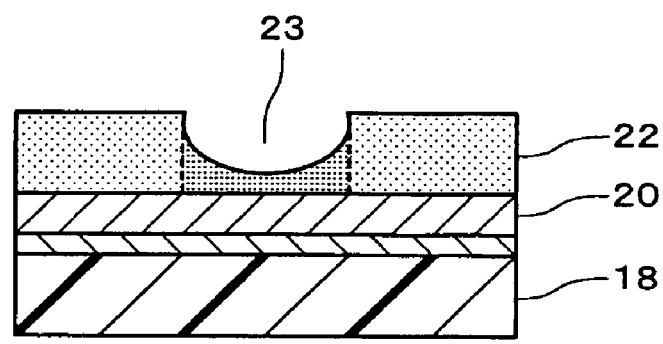
FIG. 15 illustrates the method for manufacturing a semiconductor device according to a variation of the first embodiment of the present invention.

In a variation of the method for forming the concave portion 23, a decreased level of dissolution in the development step (for example, by a shorter developing time or a lower concentration of a developer) will result in another concave portion 23, as shown in FIGS. 14 and 15. Firstly, an exposure step is performed as shown in FIG. 14. The description in the above embodiment (see FIG. 12) can be applied to this step, but in this variation, a sufficient amount of radiation 60 (for example, to form an opening that has a straight wall in the resin layer 22) is employed. Thus, the radiation 60 will reach the bottom of the resin layer 22 (a portion in contact with the wiring layer 20). The radiation 60 enters the resin layer 22 directly below the transparent portion 54. As shown in FIG. 14, the resin layer 22 may be irradiated with the radiation 60 in an area larger than the transparent portion 54, because of the radiation incident at an angle. Subsequently, when the portion of the resin layer 22 that has an increased solubility is dissolved in the development step, since the dissolution level is reduced in this step according to this embodiment, only a part of the portion that has the increased solubility can be removed, as shown in FIG. 15. A developer permeates the top surface of the resin layer 22 (opposite to the wiring layer 20), and its permeation depth gradually decreases with the distance from the center of the portion that has the increased solubility. Thus, the concave portion 23 can be formed as shown in FIG. 15.

Furthermore, even when typical exposure and development steps are performed, frequently the opening in the resin layer 22 does not have a straight wall, but has a curved wall in which the thickness of the residual resin layer 22 increases with the distance from the center of the opening. Thus, the residual resin layer 22 may shape the concave portion 23.

When the resin layer 22 is prepared from a thermosetting resin precursor, the through hole 24 can be formed by thermally curing the precursor and then removing the bottom of the concave portion 23. Dry etching, for example, may be applied to the method for forming the through hole 24.

In addition, a concave portion 26 is formed in the wiring layer 20. The through hole 24 and the concave portion 26 reside at the same position. Etching (for example, dry etching) may be used to form the concave portion 26. The method for forming the concave portion 26 may be the same as that for the through hole 24. The concave portion 26 may be simultaneously (or sequentially) formed with the formation of the through hole 24 in the resin layer 22. Alternatively, the concave portion 26 may be formed in the wiring layer 20 after the formation of the through hole 24 in the resin layer 22. The concave portion 26 at a deeper position may be smaller than its opening size. The concave portion 26 may have an inner surface without an edge. The concave portion 26 may have a gently curved inner surface.

Figure 3:
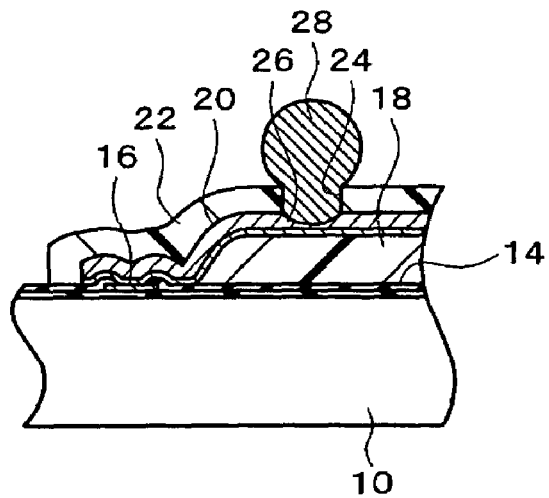
FIG. 3 illustrates the method for manufacturing a semiconductor device according to the first embodiment of the present invention.

An external terminal 28 is disposed on the wiring layer 20, as shown in FIG. 3. Particularly, the external terminal 28 is joined to the concave portion 26 in the wiring layer 20. The external terminal 28 may be in contact with the inner surface of the through hole 24 in the resin layer 22.

The external terminal 28 may be prepared from a soft solder or a hard solder. The soft solder may be free of lead (hereinafter referred to as a lead-free solder). Examples of the lead-free solder may include tin-silver (Sn—Ag), tin-bismuth (Sn—Bi), tin-zinc (Sn—Zn), and tin-copper (Sn—Cu) alloys. In addition, these alloys may further contain at least one of silver, bismuth, zinc, and copper. Conventional methods may be applied to forming the external terminal 28.

Figure 4:
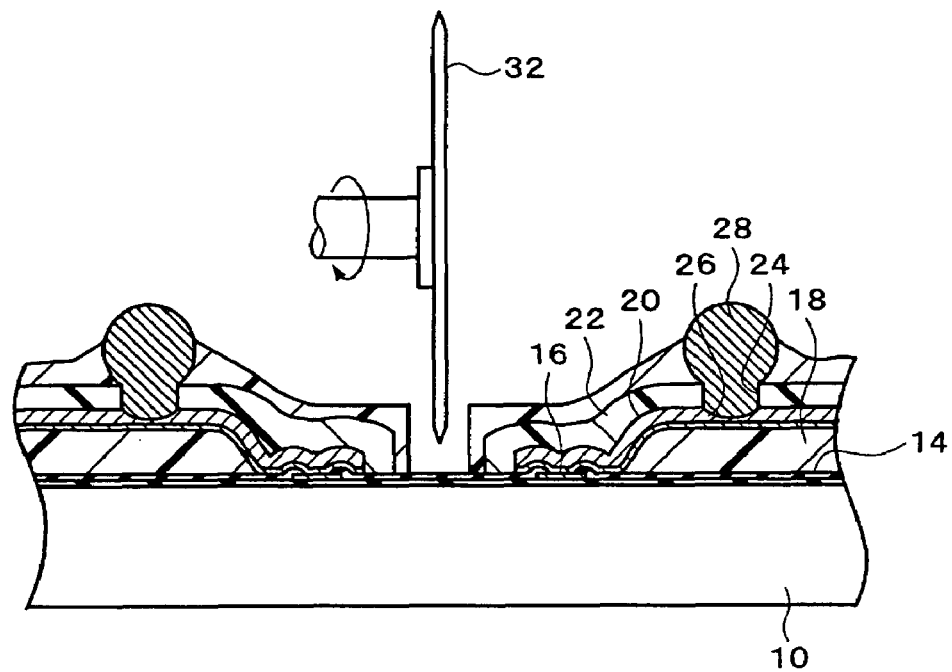
FIG. 4 illustrates the method for manufacturing a semiconductor device according to the first embodiment of the present invention.

As shown in FIG. 4, a second resin layer 30 may be disposed on the resin layer 22. The description on the stress relaxation layer 18 may be applied to the second resin layer 30. The second resin layer 30 may surround the external terminal 28. The second resin layer 30 may cover a part (for example, the basal portion) of the external terminal 28. The second resin layer 30 may cover (for example, completely cover) the resin layer 22. The second resin layer 30 may cover the entire semiconductor substrate 10 before patterning. The second resin layer 30 may be provided so as to cover the external terminal 28 and then be removed from the top edge of the external terminal 28. The description on the patterning of the stress relaxation layer 18 may also be applied to this patterning. Alternatively, the second resin layer 30 may be partially removed by laser irradiation or ashing.

A semiconductor wafer according to the embodiment of the present invention includes the semiconductor substrate 10. The semiconductor substrate 10 has a plurality of integrated circuits 12 (see FIG. 1) and the pads 16 on the front surface thereof. Each pad 16 is electrically connected to each integrated circuit 12. The wiring layer 20 is electrically connected to the pads 16. The resin layer 22 is disposed on the wiring layer 20. The external terminal 28 is located on the wiring layer 20. The second resin layer 30 surrounds the external terminal 28.

The resin layer 22 has the through hole 24. The wiring layer 20 has the concave portion 26. The through hole 24 and the concave portion 26 reside at the same position. The opening of the concave portion 26 may be included entirely within the through hole 24. The external terminal 28 may be in contact with the inner surface of the through hole 24 in the resin layer 22. The external terminal 28 is joined to the concave portion 26. Thus, the bonding strength between the wiring layer 20 and the external terminal 28 is increased by the concave portion 26. In addition, the increased contact area between the wiring layer 20 and the external terminal 28 by the concave portion 26 allows the electrical connectivity between them to be improved. The other details are as described above.

As shown in FIG. 4, the semiconductor substrate 10 is sectioned (for example, by scribing or dicing) with, for example, a cutter (or a blade) 32. Thus, a semiconductor device can be prepared.

Figure 5:
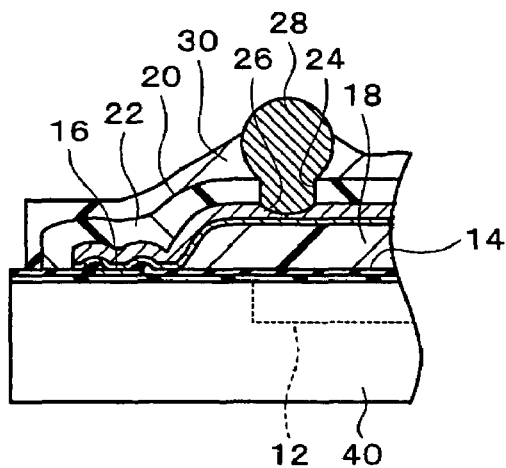
FIG. 5 is an enlarged view of a section taken along the line V—V in FIG. 6.
Figure 6:
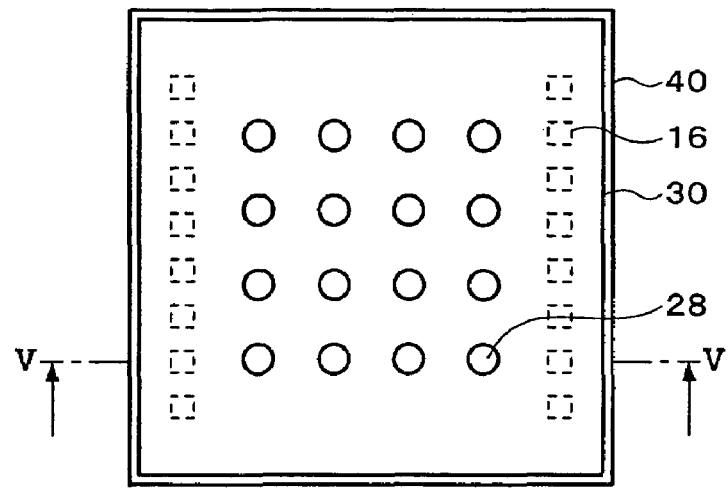
FIG. 6 illustrates the method for manufacturing a semiconductor device according to the first embodiment of the present invention.

FIGS. 5 and 6 show the semiconductor device according to the present embodiment. FIG. 5 is a section taken along the line V—V in FIG. 6. The semiconductor device has a semiconductor chip 40. The semiconductor chip 40 may be cut out from the semiconductor substrate 10. The description of the semiconductor wafer is applicable to the other details of the semiconductor device.

Second Embodiment

Figure 7:
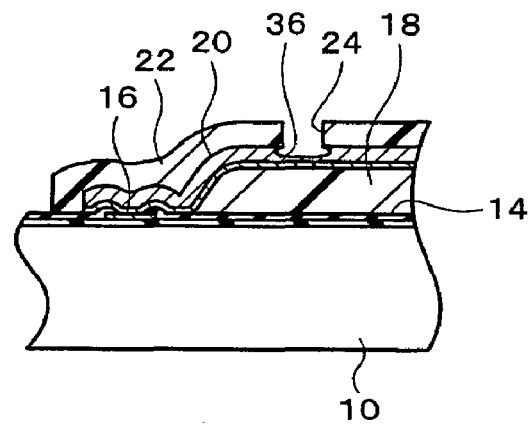
FIG. 7 illustrates the method for manufacturing a semiconductor device according to a second embodiment of the present invention.

FIG. 7 shows a method for manufacturing a semiconductor device according to a second embodiment of the present invention. In the present embodiment, the shape of a concave portion 36 in the wiring layer 20 is different from the concave portion 26 according to the first embodiment. The concave portion 36 at a deeper position is larger than its opening size. The concave portion 36 has a first width, which is larger than the opening size, at a first depth and a second width, which is smaller than the first width, at a second depth that is deeper than the first depth. The concave portion 36 in such a shape can be prepared by etching the wiring layer 20 isotropically. For example, the concave portion 36 may be formed by making the through hole 24 in the resin layer 22 followed by wet etching. The description in the first embodiment is applicable to the other details.

Figure 8:
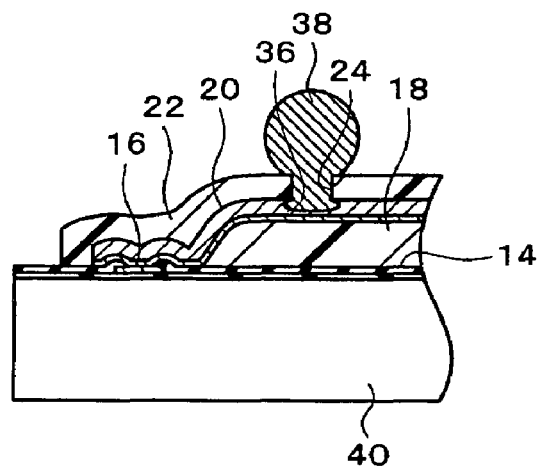
FIG. 8 illustrates a semiconductor device according to the second embodiment of the present invention.

FIG. 8 shows the semiconductor device according to the second embodiment of the present invention. The semiconductor device may be produced from the semiconductor wafer shown in FIG. 7. In this embodiment, an external terminal 38 is joined to the concave portion 36 in the wiring layer 20. Thus, the bonding strength between the wiring layer 20 and the external terminal 38 is increased by the concave portion 36. In addition, the increased contact area between the wiring layer 20 and the external terminal 38 by the concave portion 36 allows the electrical connectivity between them to be improved. The description in the first embodiment is applicable to the other details.

Figure 9:
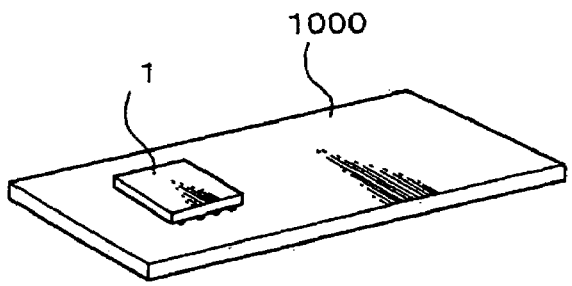
FIG. 9 illustrates a circuit board on which a semiconductor device according to the present invention is mounted.
Figure 10:
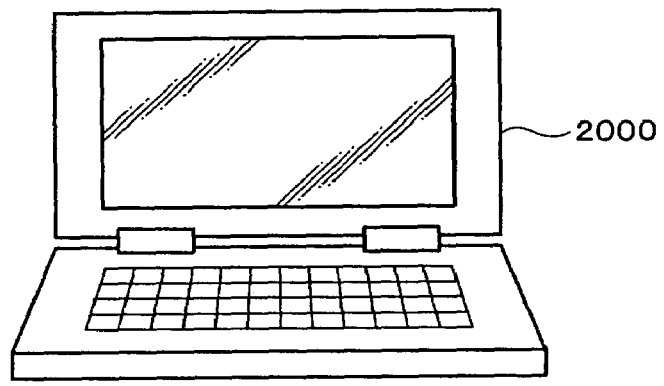
FIG. 10 shows an electronic apparatus that has a semiconductor device according to the present invention.
Figure 11:
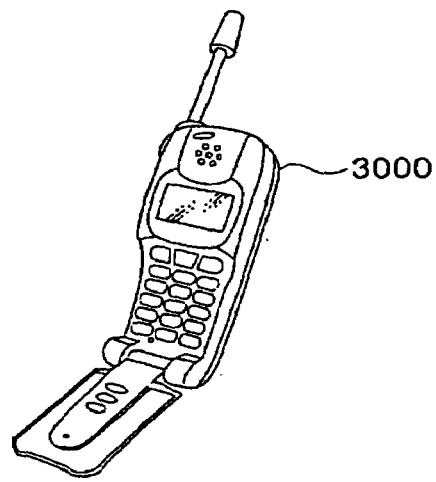
FIG. 11 shows an electronic apparatus that has a semiconductor device according to the present invention.

FIG. 9 shows a circuit board 1000 on which a semiconductor device 1 described in the above-mentioned embodiment is mounted. Examples of electronic apparatuses having this semiconductor device include a notebook personal computer 2000 shown in FIG. 10 and a cellular phone 3000 shown in FIG. 11.

The present invention is not limited to the above-described embodiments and various modifications can be made. For example, the present invention encompasses structures that are substantially identical to the structure described in the embodiments (for example, structures with the same function, method and results, or structures with the same advantage and results). Furthermore, the present invention encompasses structures in which nonessential parts of the structures described in the embodiments are replaced. The present invention also encompasses structures that have the same effects or achieve the same advantages as those of the structures described in the embodiments. The present invention further encompasses structures in which known techniques are incorporated into the structures described in the embodiments.

What is claimed is:

1. A semiconductor device, comprising:
a semiconductor chip provided with an integrated circuit and a pad that is electrically connected to the integrated circuit;
a wiring layer that has an etched concave portion and is electrically connected to the pad;
an external terminal that is joined to the concave portion of the wiring layer; and
a resin layer provided with a through hole and disposed on the wiring layer, the through hole and the concave portion residing at the same position,
wherein a width of the concave portion increases with a depth of the concave portion.

2. The semiconductor device according to claim 1, wherein an inner surface of the through hole in the resin layer is in contact with the external terminal.

3. The semiconductor device according to claim 1, further comprising a stress relaxation layer disposed on the semiconductor chip, wherein the wiring layer is disposed on the stress relaxation layer.

4. The semiconductor device according to claim 1, wherein the resin layer is prepared from a solder resist.

5. A circuit board comprising a semiconductor device according to claim 1.

6. An electronic apparatus comprising a semiconductor device according to claim 1.

7. A semiconductor device, comprising:
a semiconductor chip provided with an integrated circuit and a pad that is electrically connected to the integrated circuit;
a wiring layer that has an etched concave portion and is electrically connected to the pad;
an external terminal that is joined to the concave portion of the wiring layer; and
a resin layer provided with a through hole and disposed on the wiring layer, the through hole and the concave portion residing at the same position,
wherein the concave portion has a first width at a first depth and a second width at a second depth that is deeper than the first depth, the first width being larger than an opening size of the concave portion and the second width being smaller than the first width.

8. A semiconductor wafer, comprising:
a semiconductor substrate provided with a plurality of integrated circuits and pads with each pad electrically connected to each of the integrated circuits;
a wiring layer that has an etched concave portion and is electrically connected to the pads;
an external terminal that is joined to the concave portion of the wiring layer; and
a resin layer provided with a through hole and disposed on the wiring layer, the through hole and the concave portion residing at a same position,
wherein a width of the concave portion increases with a depth of the concave portion.

9. A semiconductor wafer, comprising:
a semiconductor substrate provided with a plurality of integrated circuits and pads with each pad electrically connected to each of the integrated circuits;
a wiring layer that has an etched concave portion and is electrically connected to the pads;
an external terminal that is joined to the concave portion of the wiring layer; and
a resin layer provided with a through hole and disposed on the wiring layer, the through hole and the concave portion residing at a same position,
wherein the concave portion has a first width at a first depth and a second width at a second depth that is deeper than the first depth, the first width being larger than an opening size of the concave portion and the second width being smaller than the first width.

10. The semiconductor wafer according to claim 9, wherein an inner surface of the through hole in the resin layer is in contact with the external terminal.

11. The semiconductor wafer according to claim 9, further comprising a stress relaxation layer disposed on the semiconductor substrate, wherein the wiring layer is disposed on the stress relaxation layer.

12. The semiconductor wafer according to claim 9, wherein the resin layer is prepared from a solder resist.

* * * * *